(12) United States Patent
Xu et al.

(10) Patent No.: US 8,579,019 B2
(45) Date of Patent: Nov. 12, 2013

(54) HEAT DISSIPATION DEVICE

(75) Inventors: Shou-Biao Xu, Shenzhen (CN);
Shi-Wen Zhou, Shenzhen (CN);
Chun-Chi Chen, Taipei Hsien (TW)

(73) Assignees: Fu Zhun Precision Industry (Shen Zhen) Co., Ltd., Shenzhen (CN);
Foxconn Technology Co., Ltd., New Taipei (TW)

( * ) Notice: Subject to any disclaimer, the term of this patent is extended or adjusted under 35 U.S.C. 154(b) by 947 days.

(21) Appl. No.: 12/641,340

(22) Filed: Dec. 18, 2009

(65) Prior Publication Data
US 2011/0024090 A1    Feb. 3, 2011

(30) Foreign Application Priority Data
Aug. 3, 2009   (CN) .......................... 2009 1 0305123

(51) Int. Cl.
*H05K 7/20* (2006.01)
(52) U.S. Cl.
USPC ..................................... 165/104.33; 361/700
(58) Field of Classification Search
USPC ..................................... 165/104.33; 361/700
See application file for complete search history.

(56) References Cited

U.S. PATENT DOCUMENTS

| | | | | |
|---|---|---|---|---|
| 7,760,501 B2 * | 7/2010 | Zha et al. | ................. | 165/104.33 |
| 7,796,387 B2 * | 9/2010 | Deng et al. | .................... | 361/697 |
| 7,969,737 B2 * | 6/2011 | Guo et al. | .................... | 361/700 |
| 8,220,527 B2 * | 7/2012 | Liu et al. | ...................... | 165/80.3 |
| 2008/0156459 A1 * | 7/2008 | Peng et al. | ............... | 165/104.33 |
| 2008/0202729 A1 | 8/2008 | Mochizuki | | |
| 2008/0210404 A1 * | 9/2008 | Peng | .......................... | 165/80.3 |
| 2009/0161315 A1 * | 6/2009 | Guo et al. | .................... | 361/700 |
| 2010/0073878 A1 * | 3/2010 | Zha et al. | .................... | 361/697 |
| 2010/0155023 A1 * | 6/2010 | Zhou et al. | .................... | 165/80.3 |

FOREIGN PATENT DOCUMENTS

TW          M317746 U       8/2007

* cited by examiner

*Primary Examiner* — Leonard R Leo
(74) *Attorney, Agent, or Firm* — Altis & Wispro Law Group, Inc.

(57) ABSTRACT

An exemplary heat dissipation device includes a base plate, two fin groups, a core, a fan holder coupled to a top of the core, a fan located over the fin groups and secured by the fan holder, and two heat pipes. The two fin groups cooperate to define a central hole in a center thereof and have a plurality of fins extending radially and outwardly from the central hole. The core is placed on the base plate and received in the central hole. Each heat pipe comprises an evaporation section sandwiched between the core and the base plate, an arc-shaped condensation section sandwiched between the two fin groups and an adiabatic section connecting the evaporation section and the condensation section.

16 Claims, 4 Drawing Sheets

HEAT DISSIPATION DEVICE

CROSS-REFERENCE TO RELATED APPLICATION

This application is related to a copending U.S. patent application Ser. No. 12,643,931, entitled "HEAT DISSIPATION DEVICE HAVING HEAT SINK ENCLOSING CONDUCTIVE MEMBER THEREIN", filed simultaneously with this application, and having the same assignee as this application. The entire contents of the copending application are incorporated herein by reference.

BACKGROUND

1. Technical Field

The disclosure generally relates to heat dissipation apparatuses and, more particularly, to a heat dissipation apparatus for dissipating heat generated by an electronic component.

2. Description of Related Art

It is well known that heat generated by operating electronic components, such as integrated circuit chips, can be very strong. If the heat is not efficiently dissipated, these electronic components may suffer damage. Thus, heat dissipation apparatuses are often used to cool the electronic components.

One kind of typical heat dissipation apparatus includes a heat sink having a plurality of fins arranged in a circle, and a plurality of heat pipes having condensation sections inserted through the fins of the heat sink. The condensation sections of the heat pipes cooperatively form a circular configuration. The condensation sections are received in the fins of the heat sink by way of moving the fins over the condensation sections one by one in a kind of sleeving process. Such an assembly process is time consuming and laborious. Furthermore, the movement of the condensation sections of the heat pipes through holes defined in the fins may scrape solder out of the holes of the fins. When this happens, the condensation sections of the heat pipes may not be firmly and intimately connected with the fins, and the mechanical strength of the heat dissipation apparatus may be reduced. As a result, the heat dissipation effectiveness and the durability of the heat dissipation apparatus are liable to be impaired.

What is needed, therefore, is a heat dissipation apparatus which can overcome the above-described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
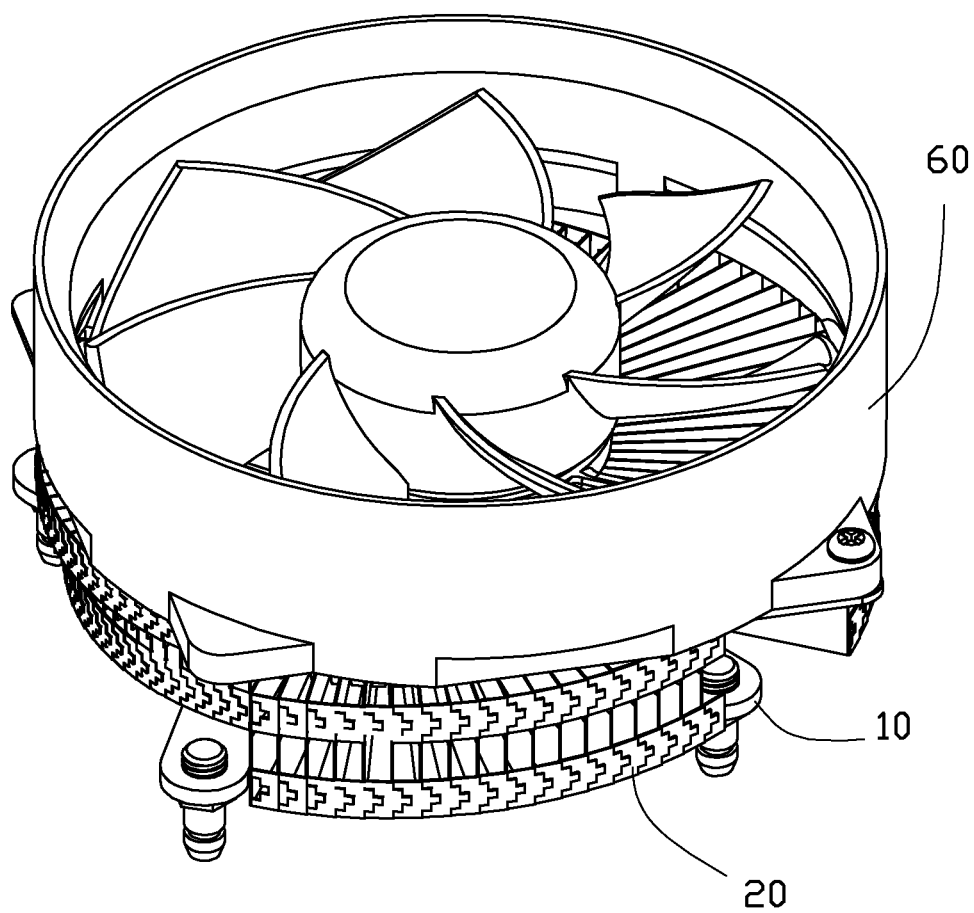
FIG. 1 is an isometric, assembled view of a heat dissipation device in accordance with an embodiment of the disclosure.
Figure 2:
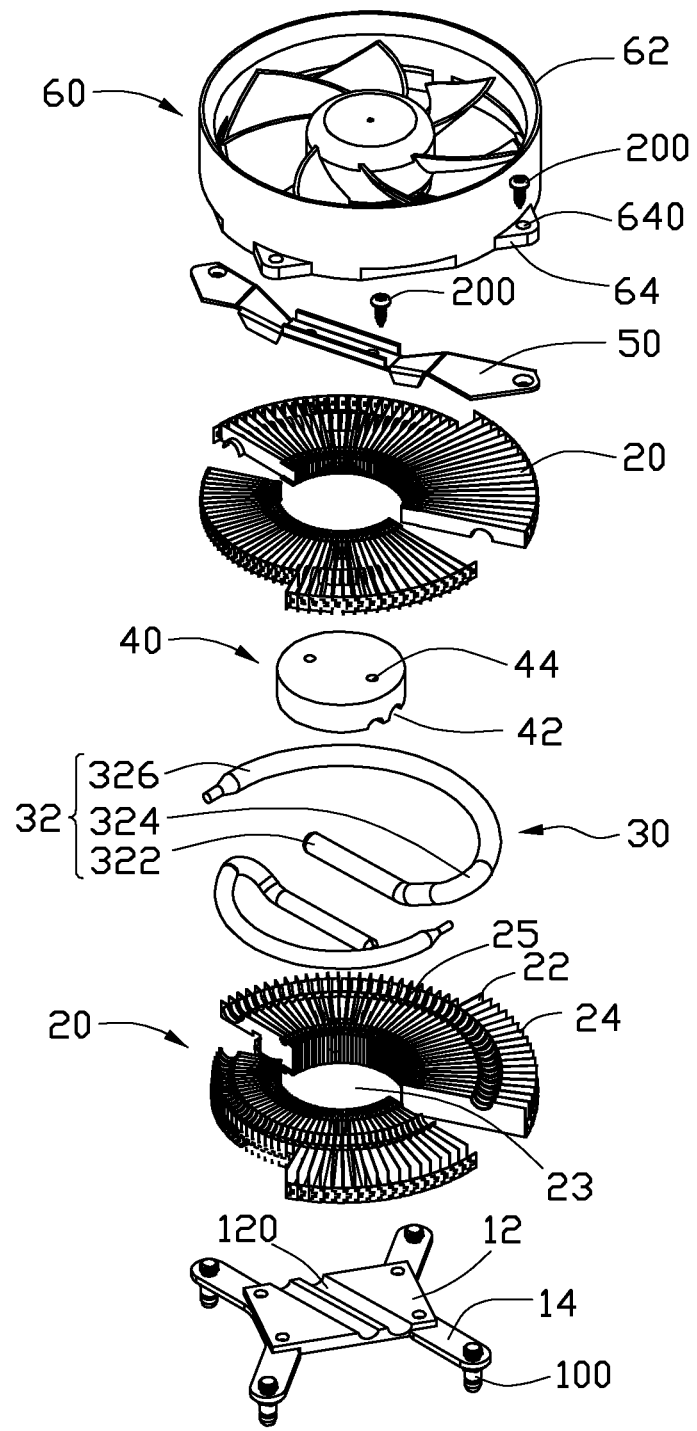
FIG. 2 is an exploded view of the heat dissipation device of FIG. 1.

Referring to FIGS. 1 and 2, a heat dissipation device in accordance with an embodiment of the disclosure is illustrated. The heat dissipation device is used to dissipate heat generated by an electronic component (not shown), such as a central processing unit (CPU) of a computer. The heat dissipation device includes a base 10, two fin groups 20, a heat pipe group 30 connecting the fin groups 20 and the base 10 together, a core 40 accommodated in the fin groups 20, a fan holder 50, and a fan 60 mounted on a top of the fin groups 20 via the fan holder 50.

The base 10 is made of copper or aluminum or other suitable heat-conducting material. The base 10 has a bottom mating surface for contacting the electronic component. The base 10 includes a rectangular base plate 12, and four mounting ears 14 extending diagonally from four corners of the base plate 12. Two elongated grooves 120 parallel to each other are defined in a top surface of the base plate 12, each elongated groove 120 being oriented slantwise to two opposite lateral sides of the base plate 12. Four fixtures 100 are mounted in the mounting ears 14, and are for attaching the base 10 onto the electronic component.

The two fin groups 20 includes a lower fin group 20 and an upper fin group 20 stacked on the lower fin group 20. Each fin group 20 has a generally annular configuration. A height of the lower fin group 20 is different from that of the upper fin group 20. In this embodiment, the lower fin group 20 has a height larger than that of the upper fin group 20.

Each fin group 20 includes two fin units 22. Each fin unit 22 is generally in the form of a truncated sector, with the inner end of the fin unit 22 truncated in a way whereby—the inner end is arc-shaped. Considered another way, each fin unit 22 is generally in the form of part of an annulus. Two cutouts are defined in two opposite circumferential sides of the combination of the two fin groups 20. The two cutouts are truncated sectors in shape, and expand radially and outwardly from a center (not labeled) of the combination of the two fin groups 20. Each fin unit 22 comprises a plurality of fins 24 spreading from a center (not labeled) thereof to a periphery thereof along horizontal directions. An outmost end of each fin 24 has a perpendicular protrusion. In each of the fin units 22, the protrusion of each fin 24 latches with an adjacent fin 24, and an inmost end of each fin 24 abuts the inmost end of the adjacent fin 24. Thereby, the fins 24 in each of the fin units 22 are latched together.

The two fin units 22 of the upper fin group 20 respectively correspond to the two fin units 22 of the lower fin group 20. The two fin groups 20 are in vertical alignment with each other, and the combination of the two fin groups 20 cooperatively define a central hole 23 for receiving the core 40. The central hole 23 is circular, and two opposite side of the central hole 23 communicate with the two cutouts, respectively. Radial lengths of the fins 24 of each of the fin groups 20 can be unequal. The radial lengths can be changed according to the actual space available for receiving the heat dissipation device when the heat dissipation device is applied in, for example, a computer. In the present embodiment, the fins 24 of the lower fin group 20 located between two neighboring mounting ears 14 of the base 10 have radial lengths longer than other fins 24 of the lower fin group 20. One of the fin units 22 of each of the top and bottom fin groups 20 defines a vertex angle smaller than that of the other fin unit 22 of that same top or bottom fin group 20. That is, an angle subtended by one fin unit 22 of each of the top and bottom fin groups 20 is less than an angle subtended by the other fin unit 22 of that same top or bottom fin group 20. The vertex angle (or subtended angle) is measured at the center of each of the top and bottom fin groups 20.

A receiving groove 25 having an arc-shaped configuration is defined in an annular top surface of each fin unit 22 of the lower fin group 20. A receiving groove 25 having an arc-shaped configuration is defined in an annular bottom surface of each fin unit 22 of the upper fin group 20. When the partly annular bottom surfaces of the fin units 22 of the upper fin group 20 snugly engage the partly annular top surfaces of the corresponding fin unit 22 of the lower fin group 20, the receiving grooves 25 cooperate to define a pair of arc-shaped channels for receiving corresponding portions of the heat pipe group 30. The partly annular bottom surfaces of the fin units 22 of the upper fin group 20 cooperatively define a discontinuous annular surface that rises gradually and continuously along a counterclockwise direction as viewed from above the upper fin group 20. That is, the discontinuous annular surface is not horizontal. The partly annular upper surfaces of the fin units 22 of the lower fin group 20 cooperatively define a discontinuous annular surface that rises gradually and continuously along a counterclockwise direction as viewed from above the lower fin group 20. That is, the discontinuous annular surface is not horizontal.

The core 40 is made of material with good thermal conductivity, such as copper. The core 40 is a solid body, and has a disk-shaped or columnar configuration. The core 40 is sized to be snugly received in the central hole 23 of the combined fin groups 20. Two parallel elongated grooves 42 slightly separated from each other are defined in a bottom surface of the core 40. The elongated grooves 42 cooperate with the two elongated grooves 120 of the base 12 to define two receiving holes for receiving corresponding portions of the heat pipe group 30. Two separated retaining holes 44 are defined in a top of the core 40, for engagingly receiving two screws 200 to secure the fan holder 50 on the core 40.

The heat pipe group 30 includes two heat pipes 32 connecting the base 10, the fin groups 20 and the core 40 together in a thermally conducting relationship. Each heat pipe 32 is bent to have an elongated evaporation section 322, an arc-shaped condensation section 326, and a bent adiabatic section 324 connecting the evaporation section 322 and the condensation section 326. The adiabatic section 324 is bent upwards from an end of the evaporation section 322, and extends obliquely and upwardly to connect with a corresponding end of the condensation section 326. The condensation section 326 is arc-shaped, and sized to snugly fit in the corresponding channel defined by two of the receiving grooves 25 of the fin groups 20. That is, the condensation section 326 is bent into a substantially semicircular configuration, and extends circumferentially from an upper end of the corresponding adiabatic section 324.

Figure 3:
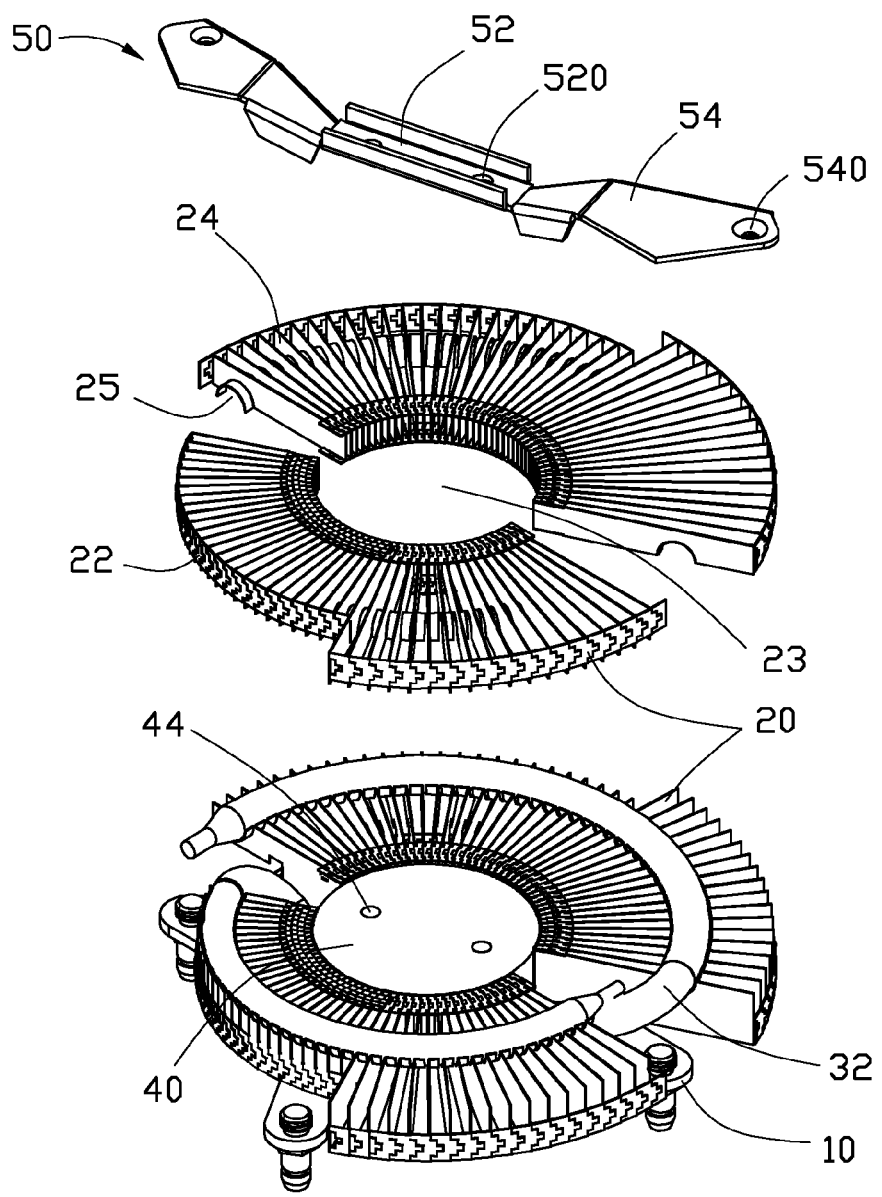
FIG. 3 is a partially assembled view of the heat dissipation device of FIG. 1, but omitting a fan thereof.
Figure 4:
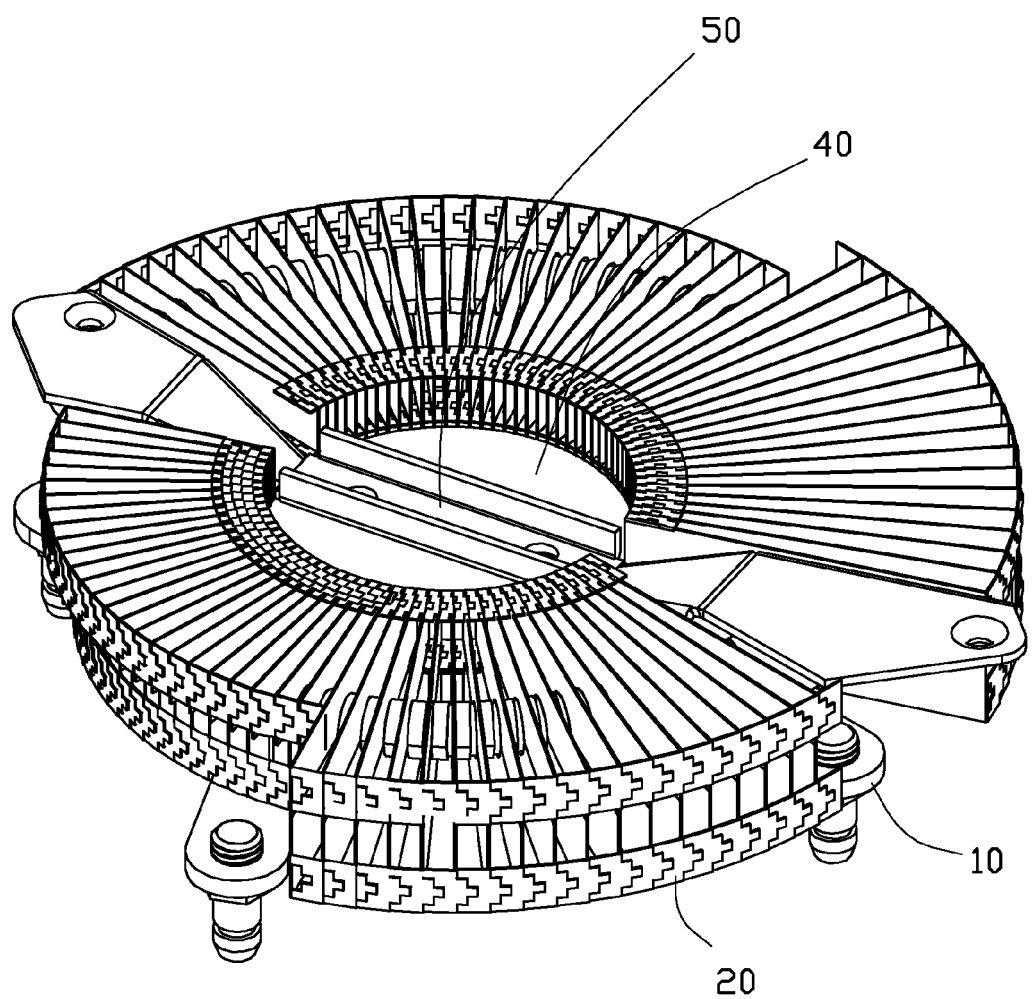
FIG. 4 is an assembled view of the parts of the heat dissipation device shown in FIG. 3.

Also referring to FIGS. 3 and 4, in assembly of the heat dissipation device, the two evaporation sections 322 of the two heat pipes 32 are sandwiched between the base plate 12 and the core 40 and respectively received in the two receiving holes cooperatively formed by the elongated grooves 120 of the base plate 12 and the corresponding elongated grooves 42 of the core 40. The core 40 is placed on the top surface of the base plate 12 and snugly received in a lower part of the central hole 23 of the combined fin groups 20. The adiabatic sections 324 of the heat pipes 32 are located in the opposite openings of the combined fin groups 20, respectively. The condensation sections 326 of the heat pipes 32 are wholly sandwiched between the two fin groups 20 and fitly received in the channels cooperatively formed by the receiving grooves 25 of the partly annular bottom surfaces of the fin units 22 of the upper fin group 20 and the partly annular top surfaces of the fin units 22 of the lower fin group 20.

The fan holder 50 includes a securing portion 52, and two mounting portions 54 extending horizontally from two opposite ends of the securing portion 52. The securing portion 52 defines two separated fixing holes 520 therein, corresponding to the two retaining holes 44 of the core 40. The two mounting portions 54 are respectively located in the two opposite openings of the combined fin groups 20, above the adiabatic sections 324 of the heat pipes 32. The mounting portions 54 each define a mounting hole 540 therein for engagingly receiving another screw 200. The screws 200 thereby mount the fan 60 on the fan holder 50.

The fan 60 has a circular frame 62 and four triangular protrusions 64 extending outwards from a circumferential sidewall of the frame 62. The protrusions 64 are equally angularly spaced around the circumferential sidewall of the frame 62. Two opposite of the protrusions 64 have bottom surfaces coplanar with a bottom surface of the frame 62, and each of these protrusions 64 defines a through hole 640 therein. The fan 60 is supported on the fan holder 50 and covers all of a top of the combined fin groups 20. The another two screws 200 are respectively extended downwardly through the two through holes 640 of the fan 60 and engagingly received in the two mounting holes 540 of the fan holder 50 to thus secure the fan 60 onto the top of the combined fin groups 20.

In use of the heat dissipation device, heat generated by the electronic component is absorbed by the base plate 12 of the base 10 and distributed to the fin groups 20 via the heat pipes 30 and the core 40. Airflow from the fan 60 travels to the fins 24 of the fin groups 20 and the core 40, to remove the heat accumulated in the fins 24 and the core 40 and dissipate the heat into the ambient environment.

In summary, the fins 24 are latched together to form the upper and lower fin groups 20. With the above-described configuration of the upper and lower fin groups 20, the fins 24 can be made very thin. Thereby, the quantity of the fins 24 and the heat dissipating area of the heat dissipation device can be significantly increased. This enhances the heat dissipating efficiency of the heat dissipation device. In addition, prior to assembly of the heat dissipation device, the fin units 22 of the fin groups 20 can be arranged into several groups. Then in assembly, the groups of fin units 22 can simply be put together to securely sandwich the condensation sections 326 of the heat pipes 32 therebetween. Thus, assembly of the heat dissipation device does not require extension of the condensation sections 326 of the heat pipes 32 through any hole or holes defined in the fin group 20. Furthermore, due to the arc-shaped configuration of the condensation sections 326 of the heat pipes 32, the assembly is simple, convenient and reliable.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
a base plate;
two fin groups, each of the fin groups comprising a plurality of fins extending radially and outwardly from a center thereof; and
two heat pipes each comprising an evaporation section engaged with a top surface of the base plate, an arc-shaped condensation section sandwiched between the two fin groups, and an adiabatic section interconnecting the evaporation section and the condensation section;

wherein one of the fin groups is stacked on the other fin group, the upper fin group has a discontinuous annular bottom surface, and the lower fin group has a discontinuous annular top surface abutting the discontinuous annular bottom surface of the upper fin group;

wherein each of the discontinuous annular top and bottom surfaces of the fin groups rises gradually and continuously along a circular direction thereof.

2. The heat dissipation device of claim 1, wherein the condensation sections of the heat pipes are embedded in the discontinuous annular top and bottom surfaces of the upper and lower fin groups.

3. The heat dissipation device of claim 2, wherein each condensation section is received in two arc-shaped receiving grooves respectively defined in the annular top and bottom surfaces of the lower and upper fin groups.

4. The heat dissipation device of claim 3, wherein the two condensation sections are wholly received in the in the discontinuous annular top and bottom surfaces of the upper and lower fin groups, and extend along a circular direction of the annular top and bottom surfaces of the fin groups.

5. A heat dissipation device comprising:
a base plate;
two fin groups, each of the fin groups comprising a plurality of fins extending radially and outwardly from a center thereof; and
two heat pipes each comprising an evaporation section engaged with a top surface of the base plate, an arc-shaped condensation section sandwiched between the two fin groups, and an adiabatic section interconnecting the evaporation section and the condensation section;
wherein one of the fin groups is stacked on the other fin group, each fin group comprises two annular sector-like fin units, the fin units of the upper fin group are stacked on the lower fin group, respectively, and the two sets of stacked fin groups are separated from each other by two openings;
wherein the combination of the two fin groups defines a central hole, the fins being arranged around the central hole and extending radially and outwardly from the central hole;
wherein a core is placed on the base plate and received in the central hole of the fin groups, and the evaporation portions of the two heat pipes are sandwiched between the core and the base plate.

6. The heat dissipation device of claim 5, further comprising a fan holder and a fan, wherein a middle portion of the fan holder is secured to a top of the core, two opposite end portions of the fan holder extending outwards from the middle portion, and the fan is secured to the end portions of the fan holder.

7. The heat dissipation device of claim 6, wherein the fan covers all of a top of the combined fin groups, the end portions of the fan holder being located in the two openings of the fin groups and located above the adiabatic sections of the heat pipes.

8. The heat dissipation device of claim 5, wherein the evaporation sections of the heat pipes are parallel to each other and embedded in a top surface of the base plate and a bottom surface of the core.

9. The heat dissipation device of claim 5, wherein for each heat pipe, the adiabatic section is bent upwardly from one end of the evaporation section and extends obliquely to connect with an end of the condensation section, the adiabatic section being located in a corresponding one of the openings.

10. A heat dissipation device comprising:
a base plate;
two fin groups stacked one on the other, the combination of the fin groups defining a central hole, each of the fin groups comprising a plurality of fins extending radially and outwardly from the central hole;
a core placed on the base plate and received in the central hole;
a fan holder attached to a top of the core;
a fan located over the fin groups and secured to the fan holder; and
two heat pipes each comprising an evaporation section sandwiched between the core and the base plate, an arc-shaped condensation section sandwiched between the two fin groups, and an adiabatic section interconnecting the evaporation section and the condensation section.

11. The heat dissipation device of claim 10, wherein one of the fin groups is stacked on the other fin group, the upper fin group has a discontinuous annular bottom surface, and the lower fin group has a discontinuous top surface abutting the discontinuous annular bottom surface of the upper fin group.

12. The heat dissipation device of claim 11, wherein the condensation sections of the heat pipes are engaged in the discontinuous annular top and bottom surfaces of the two respective fin groups.

13. The heat dissipation device of claim 12, wherein each condensation section are is received in two arc-shaped receiving grooves respectively defined in the annular top and bottom surfaces of the lower and upper fin groups.

14. The heat dissipation device of claim 11, wherein the two condensation sections are wholly received in the fin groups and extend along a circular direction of the annular top and bottom surfaces of the fin groups.

15. The heat dissipation device of claim 14, wherein the annular top and bottom surfaces of the fin groups rise gradually and continuously along a circumferential direction thereof.

16. The heat dissipation device of claim 10, wherein each fin group comprises two annular sector-like fin units separated from each other by two openings, the two adiabatic sections being located in the two openings.

* * * * *